United States Patent [19]

Harada et al.

[11] Patent Number: 4,758,894
[45] Date of Patent: Jul. 19, 1988

[54] SOLID-STATE IMAGE SENSING DEVICE WITH BIAS CARRIER INJECTION

[75] Inventors: Nozomu Harada; Yukio Endo, both of Yokohama; Yoshitaka Egawa, Tokyo, all of Japan

[73] Assignee: Kabushiki Kaisha Toshiba, Kawasaki, Japan

[21] Appl. No.: 875,725

[22] Filed: Jun. 18, 1986

[30] Foreign Application Priority Data

Jun. 21, 1985 [JP] Japan .................................. 60-135307

[51] Int. Cl.$^4$ ............................................. H04N 3/14
[52] U.S. Cl. .............................. 358/213.31; 358/223; 358/213.27
[58] Field of Search ............... 358/171, 173, 213.31, 358/213.19, 213.12, 223, 213.27

[56] References Cited

U.S. PATENT DOCUMENTS 4,369,469  1/1983  Endo et al. ..................... 358/213.31

OTHER PUBLICATIONS

IEEE Transactions on Electron Devices, vol. ED-30, No. 10; A CCD Imager with a Thin-Film Photodetector of a Heterojunction AnSe-An$_{1-x}$Cd$_x$Te; Takao Chikamura et al; Oct. 1983.

Primary Examiner—Jin F. Ng
Assistant Examiner—Stephen Brinich
Attorney, Agent, or Firm—Oblon, Fisher, Spivak, McClelland & Maier

[57] ABSTRACT

A multilayered solid-state image sensor has a photoconductive film, which covers pixels formed on a substrate, and acts as a photoelectric converting section for the pixels. The photoconductive film inherently has traps. In an imaging mode of the image sensor, before signal charges are generated in a portion of the photoconductive film corresponding to each pixel upon irradiation of image light, sufficient bias charges to fill all the traps in the photoconductive film are injected into the photoconductive film. Subsequently, excess bias charges remaining in the photoconductive film are removed therefrom. Thus, the traps in the photoconductive film are effectively filled with the bias charges, thereby deactivating the photoconductive film.

5 Claims, 3 Drawing Sheets

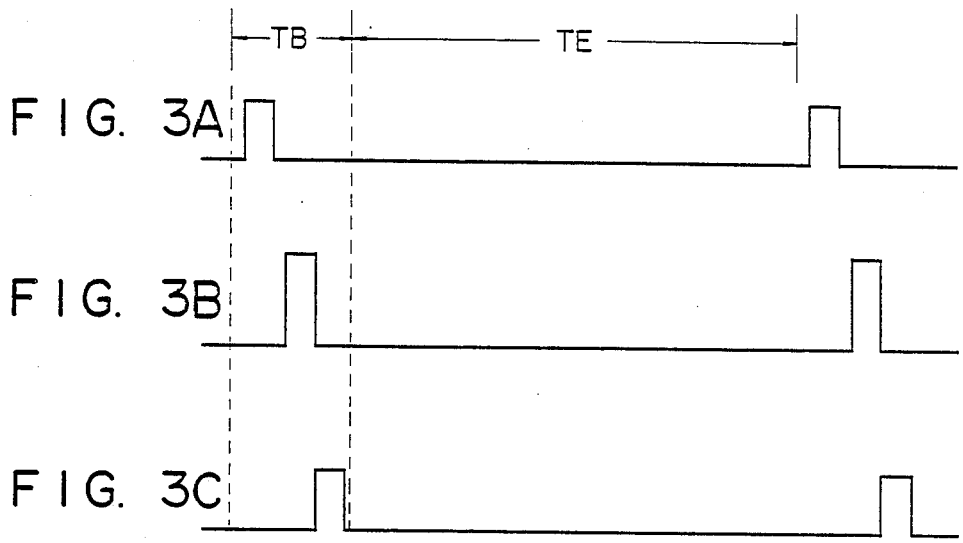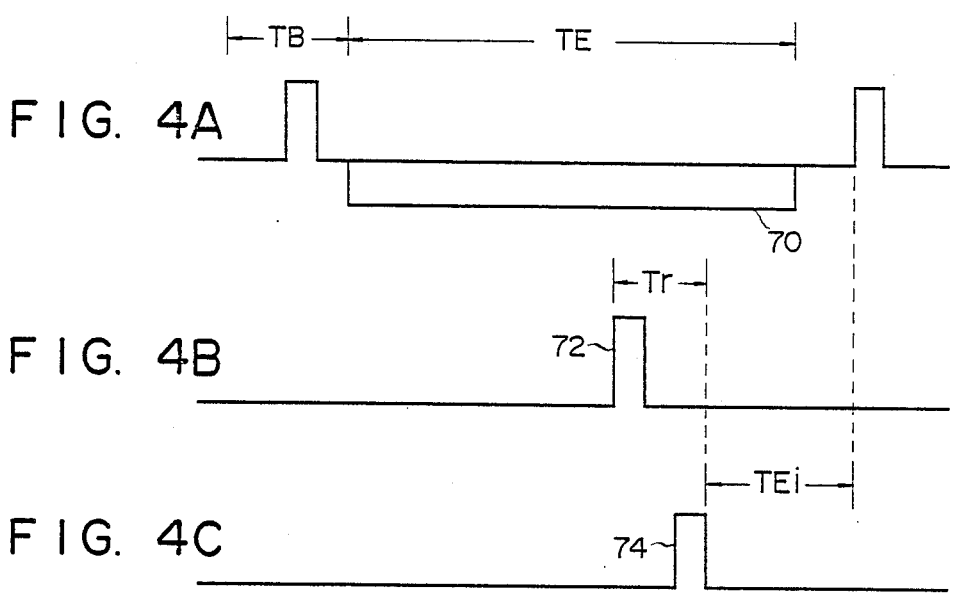

SOLID-STATE IMAGE SENSING DEVICE WITH BIAS CARRIER INJECTION

BACKGROUND OF THE INVENTION

The present invention relates to a solid-state image sensing device and, more particularly, to a double-layered (multilayered) solid-state image sensing device in which a photoconductive film, acting as a photoelectric converting section, is stacked on a substrate.

A recently developed solid-state image sensing device has a structure in which a photoconductive film, acting as a photoelectric converting section, is stacked on a chip substrate. This type of device is known as a "multilayered solid-state image sensing device" to those skilled in the art. The chip substrate is comprised of a silicon single-crystal substrate on which a cell matrix, consisting of a plurality of pixels, is formed. A signal charge storing section and a signal charge readout section, which define each pixel, are formed in the surface portion of the substrate. When the photoconductive film is stacked on the substrate, the cell opening ratio can be increased, thereby improving cell sensitivity and suppressing blooming.

A photoconductive film stacked on a substrate of an image sensor is normally made of a high-resistance semiconductor material (e.g., amorphous silicon). An amorphous silicon photoconductive film has more traps than a normal monocrystalline film. For this reason, after the image sensor is irradiated with image light, charges trapped in the photoconductive film tend to be thermally released. When signal charges are read out, if charges trapped in the photoconductive film over a plurality of field images are released, these charges become mixed in with an image signal, as a residual output, thereby causing an "after-image". As a result, reproduced image quality is degraded. This problem is inherent in doublelayered (multilayered) solid-state image sensing devices, and limits the practical application range of these devices.

In order to suppress the above after-image phenomenon, it is generally understood that the number of traps which are inherently present in the photoconductive film must be decreased. However, the number of traps relates directly to the material comprising the amorphous silicon film, and it is very difficult to greatly reduce this number.

In another method for reducing the number of traps in the photoconductive film, the film is irradiated with bias light, to fill the traps with bias charges. When the traps are filled with bias charges, since the photoconductive film can no longer trap charges, it is converted into a virtually inactive film. In this case, however, when signal charges are read out, the bias charges trapped in the photoconductive film may often be read out together with effective signal charges produced upon irradiation of image light. If the bias charges are read out together with the effective signal charges, this causes the amount of bias charges in the image sensor to be unstable, and noise components contained in an image increase. As a result, the signal-to-noise (S/N) ratio of a reproduced image is degraded. Therefore, although a solution to the problem of preventing an after-image in a multilayered solid-state image sensing device has been greatly desired, it has not yet been found.

SUMMARY OF THE INVENTION

It is therefore an object of the present invention to provide a new and improved image-sensor drive technique for a multilayered solid-state image sensing device, which is free from degradation in its basic performance and can minimize the after-image phenomenon.

A multilayered solid-state image sensor comprises (i) a cell matrix, which is formed on a substrate, and consists of a plurality of pixels; and (ii) a photoconductive film which is formed on the substrate to cover the pixels, and which acts as the photoelectric converting section of the pixels. The photoconductive film inherently has traps. When signal charges, which are produced from the photoconductive film portions corresponding to pixels upon irradiation of image light, are read out in an imaging mode of the image sensor, sufficient bias charges to fill all the traps in the photoconductive film, are injected thereinto. Subsequently, excess bias charges remaining in the photoconductive film, which is deactivated by the above procedure, are removed. By use of these two steps, the above object of the present invention can be achieved. Other features, effects, and objects of the present invention will be understood from the following descriptions.

BRIEF DESCRIPTION OF THE DRAWINGS

The present invention is best understood by reference to the accompanying drawings, in which:

FIGS. 3A to 3C are timing charts of waveforms of electrical signals produced from the main part of the image sensing device, shown in FIG. 1; and FIGS. 4A to 4C are timing charts of waveforms of electrical signals produced from the main part of an image sensing device, according to another embodiment of the present invention.

DETAILED DESCRIPTION OF THE PREFERRED EMBODIMENTS

Figure 1:
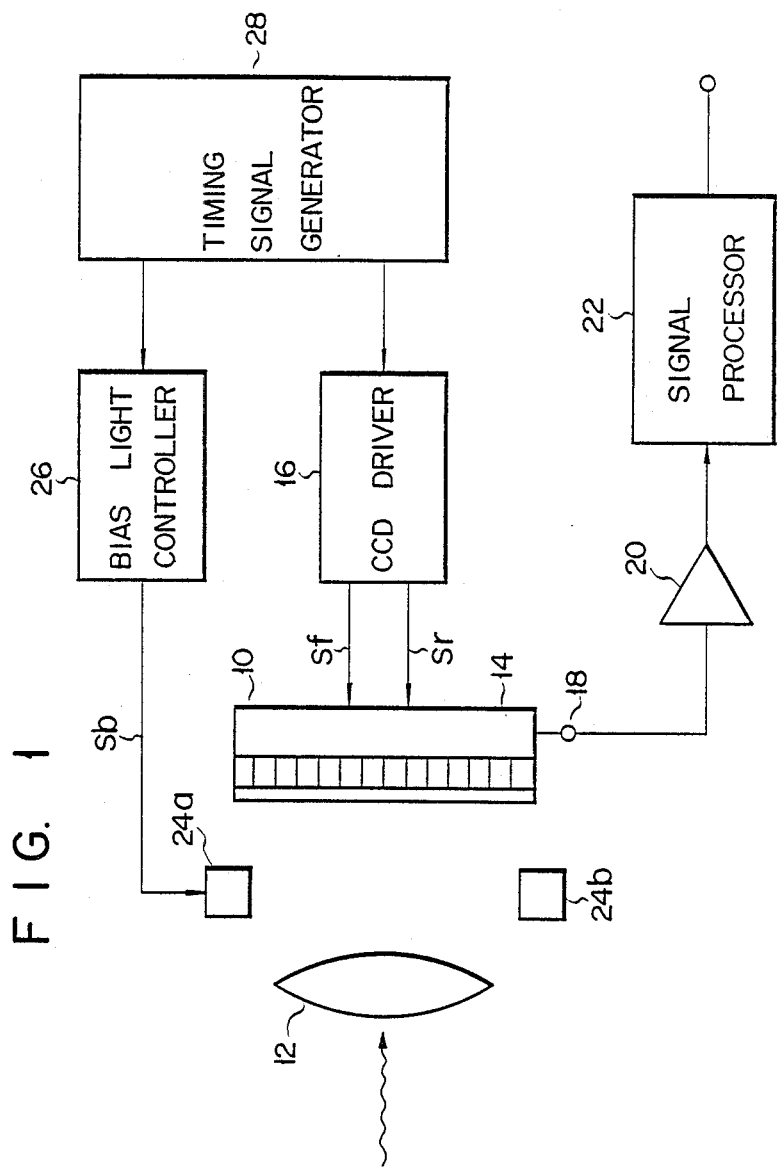
FIG. 1 is a block diagram schematically illustrating the overall arrangement of an image sensing device including a multilayered solid-state color image sensor, according to an embodiment of the present invention.

As shown in FIG. 1, in a color image sensing device according to an embodiment of the present invention, multilayered solid-state color image sensor 10 is arranged to face optical lens 12 and performs an imaging operation in accordance with an interline transfer technique. Image light indicated by the wavy arrow in FIG. 1 is focused on image sensor 10 through lens 12, to be sensed thereby. Although schematically illustrated in FIG. 1, a cell matrix consisting of a plurality of pixels is provided on substrate 14 of image sensor 10. CCD driver 16 is connected to image sensor 10, to electrically drive it. Signal charges are generated in pixels upon irradiation of image light. The signal charges are read out, in a known manner, by CCD driver 16 and are output from CCD output terminal 18. The CCD output signal is supplied to signal processor 22, via amplifier 20, thus obtaining a color reproduction image signal.

Bias light sources 24a and 24b are provided to face the imaging surface of image sensor 10. In this embodiment, these light sources 24a and 24b may be light-emitting diodes. Light-emitting diodes 24a and 24b are connected to light source driver 26. Driver 26 electrically drives light-emitting diodes 24a and 24b, thereby controlling the light-emitting operation thereof. When diodes 24a and 24b are turned on, appropriate bias light is radiated onto the imaging surface of image sensor 10 to produce bias charges therein. The two drivers 16 and 26 (driver 26 will be referred to as bias light controller hereinafter) are connected to timing signal generator 28, and receive a sync pulse signal produced therefrom. Therefore, bias light radiation to image sensor 10 is synchronized with the signal-charge readout operation in image sensor 10 at a predetermined timing, which is determined by the sync pulse signal.

Figure 2:
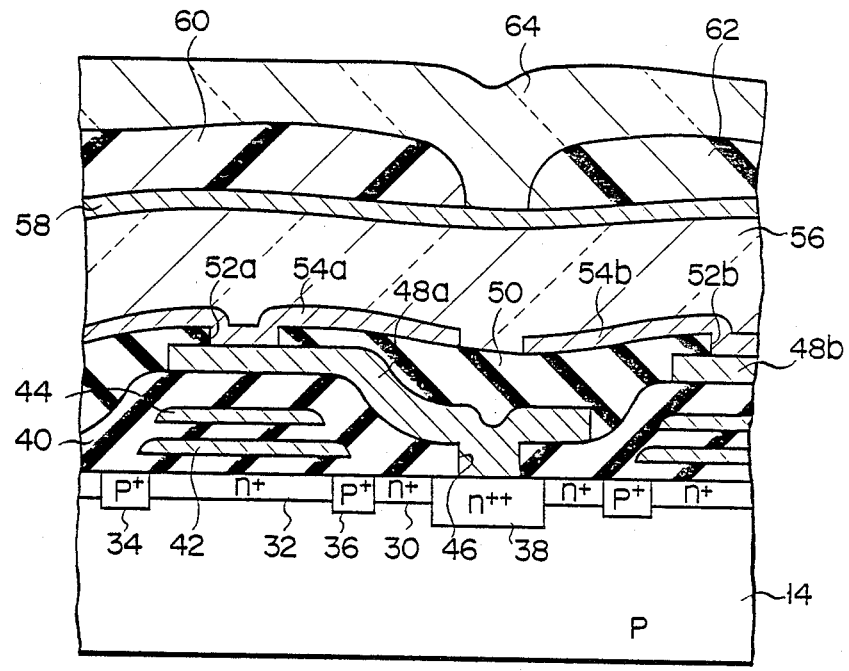
FIG. 2 is a sectional view of a main part of the image sensor shown in FIG. 1, i.e., one pixel portion and a portion of a pixel adjacent thereto.

FIG. 2 is a detailed sectional view of the main part of image sensor 10, i.e., one pixel portion and a portion of a pixel adjacent thereto. N+-type diffusion layer 30, acting as a signal charge storing section, and n+-type diffusion layer 32, acting as a signal charge readout section, are formed in the surface portion of p-type substrate 14. Known p+-type channel stopper layers 34 and 36 are formed on two sides of signal charge readout section 32. Signal charge storing section 30 is in contact with layer 36 at one end, and is in contact with n++-type diffusion layer 38 at its other end.

Insulative layer 40 of a silicon oxide film is formed on substrate 14. Two electrode layers 42 and 44, acting as carrier-transfer electrodes, are formed in layer 40, above section 32. Electrode layers 42 and 44 are electrically insulated from each other by a gate oxide film. Layer 40 has opening 46 in a portion corresponding to layer 38. Metal electrode layer 48a is formed on layer 40, to be in contact with layer 38 via opening (contact hole) 46. Another electrode layer 48b is similarly formed on layer 40. Electrode layers 48a and 48b are formed of, e.g., aluminum. Second insulative layer 50 is deposited to cover electrode layers 48a and 48b. Layer 50 has openings (contact holes) 52a and 52b on the surfaces of layers 48a and 48b electrically contacting layer 38. Cell electrode layers 54a and 54b are formed to cover openings 52a and 52b of layer 50. Therefore, layer 30 is electrically connected to corresponding cell electrode layer 54a, via layers 38 and 48a.

Amorphous silicon layer (photoconductive film) 56 is formed on second insulative layer 50, to cover cell electrode layers 54a and 54b therewith. Transparent conductive film 58 of ITO is formed on layer 56. A color filter layer portion is formed on layer 58. The color filter layer portion includes first color filter layers 60, 62, . . . corresponding to respective pixel regions. Protective layer 64 is formed on the entire surface of the structure, to cover layers 60 and 62.

It should be noted that n+-layer 30 and n++-layer 38, and electrode layers 54 and 48 are independently formed for each pixel, and are aligned on substrate 14 to form a two-dimensional cell matrix. Each of electrode layers 54a, 54b, . . . defines an imaging pixel region of image sensor 10. A change in potential is generated in cell electrode layer 54 upon a photosensing operation of photoconductive film 56, and is transferred to section 30 of the corresponding pixel, via layers 48a, 48b, . . . and layer 38, to be integrated as charges (signal charges) corresponding to incident image light. Stored carriers are then appropriately read out, in a known manner, through section 32 acting as a CCD channel, under the control of CCD driver 16.

An operation mode of the multilayered color solid-state image sensing device will now be described with reference to FIGS. 3A to 3C. Referring to FIGS. 3A to 3C, "TB" represents a vertical blanking period of image sensor 10, and "TE" represents a vertical effective period of 1 field of image sensor 10.

During vertical blanking period TB (e.g., 1/60 sec according to a normal television method) of the imaging operation of image sensor 10, field shift pulse signal Sf is produced by CCD driver 16, as shown in FIG. 3A. Signal Sf is supplied to image sensor 10. In response to signal Sf, signal charges produced in photoconductive film 56 (corresponding to incident image light) are transferred to section 32, via layer 30.

Subsequently, during period TB, bias light generation signal Sb (FIG. 1) is supplied from bias light controller 26 to light-emitting diodes 24a and 24b. FIG. 3B shows the pulse waveform of signal Sb. In response to signal Sb, diodes 24a and 24b emit bias light in the form of pulses (i.e., intermittently). When signal Sb is at low level, diodes 24a and 24b emit no bias light. Bias light is radiated onto the imaging surface of image sensor 10. Upon irradiation of bias light, bias charges are injected into photoconductive film 56, which inherently has a large number of traps. The bias charges are carriers with the same polarity as that of signal charges. In this embodiment, for example, the bias and signal charges are electrons. Upon injection of bias charges, the traps in photoconductive film 56 are filled with electrons having the same polarity as that of signal charges. The amount of bias light emitted from diodes 24a and 24b is set to produce sufficient bias carriers to fill all the traps in photoconductive film 56.

During period TB, after signal Sb for injecting bias charges is applied, CCD driver 16 produces pulse signal Sr shown in FIG. 3C. Signal Sr is applied to transparent conductive film 58. Application of signal Sr is to remove electrons (excess carriers) which are present in photoconductive film 56 as excess bias charges, while all traps therein remain filled with bias charges. Signal Sr is emitted at high level, as is signal Sf (FIG. 3A), in order to preset section 32 and layer 38. When signal Sr is at low level, an electric field for removing charges is not formed in film 56, and therefore normal charge accumulation is performed in film 56.

According to the embodiment of the present invention, (i) during vertical blanking period TB, bias light is emitted in response to signal Sb, to inject sufficient bias charges to fill all the traps in photoconductive film 56, and (ii) excess bias charges in photoconductive film 56 are removed in response to signal Sr, before signal charge accumulation is performed in the next field. Therefore, excess bias charges remaining in photoconductive film 56 can be minimized. As a result, the traps in film 56 can be effectively deactivated. Furthermore, since excess bias charges can be prevented from being read out together with signal charges, formation of an after-image can be suppressed, and noise components (background noise) mixed in with the image, due to unstable injection of bias charges, can be reduced. In addition, with this embodiment, since excess bias charges left in film 56 can be directly removed before the readout operation of effective signal charges, the amount of unnecessary carriers can be minimized, thereby miximizing the amount of signal charges to be transferred within image sensor 10. As a result, an image sensor with a wide dynamic range can be expected.

It should be noted that diodes 24a and 24b, which intermittently emit bias light, can be modified to emit low intensity bias light even when signal Sb is at low level. In this case, the low level of signal Sb is slightly higher than zero volts, and diodes 24a and 24b emit low intensity bias light having an intensity corresponding to this low level. In this case the imaging surface of image sensor 10 is continuously irradiated with low intensity bias light. The purpose of this is to continuously fill the traps, which thermally release charges at a time constant shorter than effective period TE, with small bias charges so as not to cause adverse influence such as noise components. As a result, the traps in film 56 can be more effectively deactivated.

Another embodiment of the present invention will now be described with reference to FIGS. 4A to 4C. In this embodiment, bias light generation signal Sb and charge removing pulse signal Sr are respectively supplied to bias light sources 24a and 24b, and image sensor 10 during vertical effective period TE.

Field shift pulse signal Sf having the waveform shown in FIG. 4A is applied to the same image sensor 10 as in the previous embodiment during vertical blanking period TB. Signal charges are produced in amorphous silicon photoconductive film 56 and are transferred to n+-type diffusion layer 32 acting as a vertical CCD accumulating region. Referring to FIG. 4A, reference numeral "70" designates vertically transferred signal charges (i.e., corresponding to the CCD output signal). As shown in FIG. 4B, at a certain timing during vertical effective period TE, bias light generation pulse 72 of signal Sb is applied to bias light sources 24a and 24b. In response to this, light sources 24a and 24b emit bias light. When film 56 of image sensor 10 is irradiated with bias light, bias charges are injected into all the traps in film 56.

As shown in FIG. 4C, during period TE, pulse 74 of signal Sr is applied to transparent conductive film 58 of image sensor 10 at a predetermined period of time after application of pulse 72. After irradiation of bias light to film 56, charge-removing pulse 74 is applied to film 58 of sensor 10. Thus, after traps of film 56 are filled with bias charges, excess charges remaining in film 56 are removed through film 58. Interval Tr (FIG. 4B), from the beginning of application of pulse 72 to the end of application of pulse 74, corresponds to an interval for deactivating traps in film 56.

During period TEi in period TE, after application of pulse 74 is completed and signal Sr goes to low level, since film 58 is held at a low potential level, signal charges generated in film 56 upon incidence of optical image, are transferred to cell electrode layer 54a (FIG. 2), to be accumulated thereon. Signal charge accumulation continues until signal Sf is applied in the next field period. Therefore, period TEi corresponds to an effective accumulation period of signal charges.

When application timings of pulses 72 and 74 are set as above, the same effect as in the previous embodiment can be obtained. In this case, since traps in film 56 can be effectively filled with injected bias charges, film 56 can be effectively deactivated. As a result, a uniform background CCD output can be obtained. In addition, with this embodiment, when trap deactivation period Tr is appropriately shifted within period TE, without changing the relationships in generation timing between pulses 72 and 74, period TEi can be changed as desired. More specifically, during a period including bias charge injection, excess bias charge removal, and the beginning of signal charge accumulation, since the waveform of the voltage applied to film 56 is not changed, even if the length of period TEi is changed, excess bias charge removal can be performed effectively. If the length of period TEi is changed, a bias charge output of uniform level can be obtained.

Although the present invention has been shown and described with reference to particular embodiments, various changes and modifications, which are obvious to a person skilled in the art to which the invention pertains, are deemed to lie within the scope of invention.

For example, in the above embodiments, light-emitting diodes 24a and 24b are provided to inject bias charges into film 56. However, bias charge injection means is not limited to optical bias charge injection means (e.g., light-emitting diodes) but can be electrical bias charge injection means. A voltage is then applied to transparent conductive film 58 to remove excess bias charges. However, the present invention is not limited to this, and another method can be adopted. For example, special-purpose metal electrodes are provided around each pixel in the form of a grid, and can be used as excess charge-removing means. In addition, an overflow drain section can be provided in the chip substrate of the image sensor.

What is claimed is:

1. An image sensing device comprising:
   (a) a mullitilayered solid-state image sensor comprising,
   a substrate,
   a plurality of pixels formed on said substrate, and
   a photoconductive film which is formed on said substrate and acts as a photoelectric converting section of the pixels, said photoconductive film inherently having traps; and
   (b) trap deactivating means, connected to said image sensor, for, when signal charges generated in a portion of said photoconductive film, corresponding to each pixel, in response to incident image light, are read out in an imaging mode of said image sensor, (i) injecting bias charges, sufficient to fill all the traps in said photoconductive film, into said photoconductive film, and (ii) removing excess bias charges which are left in said photoconductive film thus deactivated by bias charge filling, said trap deactivating means comprising,
   driver means for generating first and second electrical pulse signals,
   light-emitting diode means, arranged to face said image sensor, for emitting, in response to the first signal, a bias light of a first intensity toward said image sensor so as to optically inject the bias charges into said photoconductive film, and for, otherwise, emitting toward said image sensor a bias light of a second intensity lower than the first intensity, and
   charge removing means for removing, in response to the second electrical pulse signal, the excess bias charges left in said photoconductive film which is deactivated by filling the traps with the bias charges.

2. The device according to claim 1, wherein said light-emitting diode means injects charges having the same polarity as that of the signal charges, into said photoconductive film, as the bias charges.

3. The device according to claim 2, wherein said charge removing means removes excess bias charges left in said photoconductive film during a vertical blanking period of said image sensor.

4. The device according to claim 2, wherein said charge removing means removes excess bias charges left in said photoconductive film during a vertical effective period of said image sensor.

5. The device according to claim 2, wherein said light-emitting diode means comprises a plurality of light-emitting diodes.

* * * * *